United States Patent [19]
Yee

[11] Patent Number: 5,453,706
[45] Date of Patent: Sep. 26, 1995

[54] FIELD PROGRAMMABLE GATE ARRAY PROVIDING CONTENTION FREE CONFIGURATION AND RECONFIGURATION

[75] Inventor: Wilson K. Yee, Tracy, Calif.

[73] Assignee: Xilinx, Inc., San Jose, Calif.

[21] Appl. No.: 223,391

[22] Filed: Apr. 1, 1994

[51] Int. Cl.$^6$ .................................................. H03K 19/00
[52] U.S. Cl. .................................. 326/93; 326/39; 326/21
[58] Field of Search ................................ 307/465, 443, 307/480, 465.1; 326/39, 41, 21, 93, 82

[56] References Cited

U.S. PATENT DOCUMENTS

| | | | |
|---|---|---|---|
| Re. 34,363 | 8/1993 | Freeman | 307/465 |
| 4,124,899 | 11/1978 | Birkner et al. | 364/716 |
| 4,706,216 | 11/1987 | Carter | 365/94 |
| 4,750,155 | 6/1988 | Hsieh | 365/203 |
| 4,758,745 | 7/1988 | Elgamal et al. | 307/465 |
| 4,783,606 | 11/1988 | Goetting | 307/465 |
| 4,821,233 | 4/1989 | Hsieh | 365/203 |
| 4,870,302 | 9/1989 | Freeman | 307/465 |
| 4,920,515 | 4/1990 | Obata | 307/468 |
| 5,010,258 | 4/1991 | Usami et al. | 307/443 |
| 5,136,185 | 8/1992 | Fleming et al. | 307/465 |
| 5,148,390 | 9/1992 | Hsieh | 365/95 |
| 5,198,705 | 3/1993 | Galbraith et al. | 307/465 |
| 5,243,238 | 9/1993 | Kean | 307/465 |
| 5,258,668 | 11/1993 | Cliff | 307/465 |
| 5,260,611 | 11/1993 | Cliff | 307/465 |
| 5,260,881 | 11/1993 | Agrawal et al. | 364/489 |
| 5,267,187 | 11/1993 | Hsieh | 364/784 |
| 5,280,202 | 1/1994 | Chan | 307/465 |

FOREIGN PATENT DOCUMENTS

WO93/05577  8/1992  WIPO.

OTHER PUBLICATIONS

Xilinx, Inc, The Programmable Logic Data Book, 1993, pp. 1–1 through 1–7; 2–1 through 2–42; 2–97 through 2–130; and 2–177 through 2–204, available from Xilinx, Inc., 2100 Logic Drive, San Jose, Calif. 95124.

Xilinx Programmable Gate Array Data Book, 1989, pp. 6–30 through 6–44, available from Xilinx, Inc., 2100 Logic Drive, San Jose, Calif. 95124.

Morales, Luis, "Boundary Scan in XC4000 Devices", XAPP 017.001, Oct. 1992, pp. 2–108 and 2–180.

Primary Examiner—Edward P. Westin
Assistant Examiner—Jon Santamauro
Attorney, Agent, or Firm—Edel M. Young

[57] ABSTRACT

A circuit and method in a field programmable gate array (FPGA) for eliminating programming contentions which occur during array configuration comprises a switching matrix of crossing lines, in which cross points, called programmable interconnection points (PIPs), are connected by configuration transistors. The configuration transistors can be programmed to connect the lines at the PIPs or to leave the lines unconnected. Output drivers are selectively connected by the PIPs to the signal lines. Prior to the configuration and reconfiguration of the FPGA, drivers to the gate array are disabled to prevent potentially catastrophic driver contention. The contention eliminating circuit of the present invention holds the logical values of the output buffers to a single logic level until programming has been completed. The circuit of the preferred embodiment comprises a two input AND gate which combines the incoming data signals with a gating signal. The first set of AND gate inputs receives and transmits the incoming data used for driving the input buffers. The second set of inputs to the AND gates receives enable signals which control the propagation of the input data to the PIP array until programming of the PIPs is completed.

10 Claims, 9 Drawing Sheets

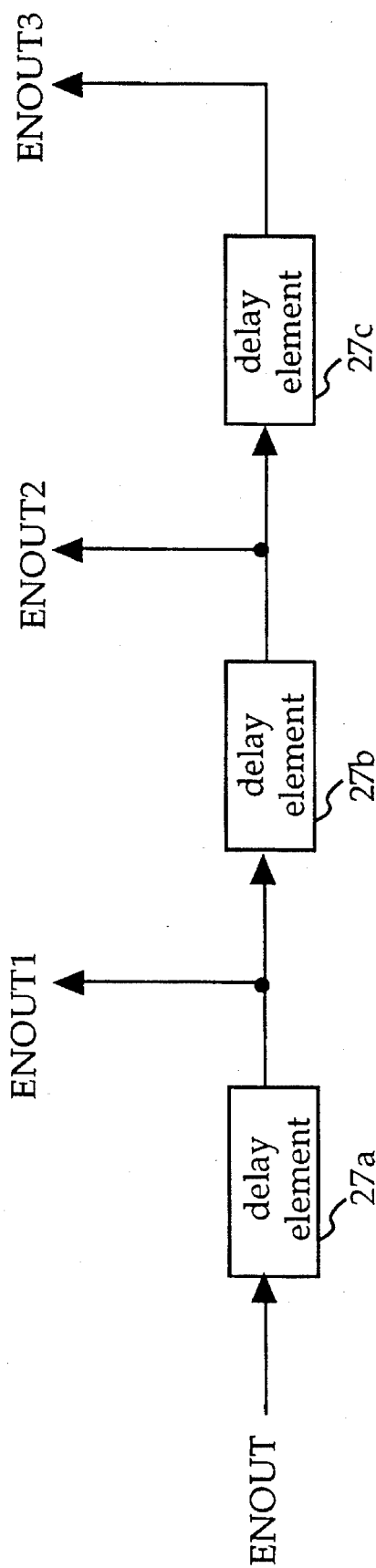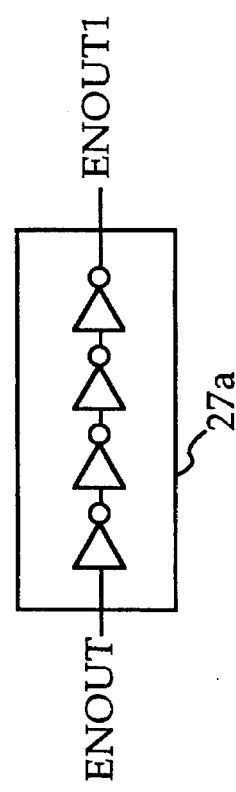
FIG. 4
FIG. 4A

FIELD PROGRAMMABLE GATE ARRAY PROVIDING CONTENTION FREE CONFIGURATION AND RECONFIGURATION

RELATED APPLICATIONS

This application relates to the following concurrently filed and commonly assigned co-pending U.S. patent applications:

1. Ser. No. 08/222,138 invented by Danesh Tavana, Wilson K. Yee, and Victor A. Holen entitled "TILE BASED ARCHITECTURE FOR FPGA",
2. Ser. No. 08/221,679 invented by Danesh Tavana entitled "I/O INTERFACE CELL FOR USE WITH OPTIONAL PAD",
3. Ser. No. 08/223,083 invented by Wilson K. Yee entitled "A PROGRAMMABLE SCAN-CHAIN TESTING STRUCTURE AND METHOD",
4. Ser. No. 08/223,247 invented by Lawrence C. Hung and Charles R. Erickson entitled "A PROGRAMMABLE LOGIC DEVICE INCLUDING A PARALLEL INPUT DEVICE FOR LOADING MEMORY CELLS", and
5. Ser. No. 08/222,141 invented by Lawrence C. Hung entitled "A PROGRAMMABLE LOGIC DEVICE WITH PARTIALLY CONFIGURABLE MEMORY CELLS AND A METHOD FOR CONFIGURATION", all of which are incorporated herein by reference.

BACKGROUND OF THE INVENTION

1. Field of the Invention

This invention relates generally to electronic integrated circuits, and more particularly to a circuit and method for programming programmable interconnect points (PIPs) in a field programmable gate array (FPGA).

2. Description of the Background Art

FIG. 1 illustrates a simplified schematic diagram of the routing matrix of a conventional field programmable gate array (FPGA) circuit. An FPGA is a group of logic blocks feeding a routing matrix consisting of routing lines and programmable interconnect points (PIPs). The PIPs interconnect the routing lines, and individually act as switches for selectively connecting two intersecting routing lines together. FIG. 1 illustrates only three routing lines L1–L3. In an actual chip there are many more lines, and many FPGAs, including those made by Xilinx, Inc. (assignee of the present invention) include a matrix of intersecting routing lines to which logic block input and output lines can be connected, and which can be connected to each other through PIPs. FIG. 1A illustrates one conventional structure for a PIP. Transistor T has its source and drain terminals connected to the horizontal and vertical lines which intersect at the PIP. Memory cell M applies a high or low signal to the gate of transistor T and determines whether transistor T will connect the horizontal and vertical lines. A set of configuration memory cells determine which PIPs should be on and which should be off. Memory cells are typically loaded shortly after an initialization period in which the chip is powered up, a global reset signal is asserted, and voltages throughout the chip have stabilized. Depending on the programming of each of the PIPs in the array, great routing flexibility for connecting selected logic block output lines to selected logic block input lines can be achieved.

A significant problem associated with the use of PIPs in programmable logic devices, is the contention potential which exists prior to and during device configuration. Contention occurs when PIPs simultaneously connect the outputs of two or more output drivers carrying different logic values (voltage levels) to the same node or routing line. To avoid contention before and during the configuration stage, the state of all PIPs is conventionally set to be off during and following power up. This conventional technique requires the use of a special memory cell that can power up to a known state prior to FPGA initialization. Such a memory cell is described by Hsieh in U.S. Pat. No. 4,821,233, which is incorporated herein by reference.

Contention problems also occur during reconfiguration of the FPGA. Reconfiguration is required where the FPGA is to utilize more than one programmed configuration. If configuration memory cells were sequentially switched from one configuration to another, it is likely that during the transition of the cells, both high and low voltages would simultaneously be connected to the same node. In this case, even though the reconfigured design does not cause contention, there is a likelihood that as PIPs are turned on and off to change from the first configuration to the second configuration, contention will occur.

What is needed is a circuit and method for contention free configuration and reconfiguration in a field programmable gate array.

SUMMARY OF THE INVENTION

The present invention is a circuit and method in an SRAM-based field programmable gate array (FPGA) for eliminating contention between output drivers which occurs before and during gate array configuration. The FPGA includes a switching matrix of intersecting lines in which cross points, called programmable interconnection points (PIPs), are connected by configuration transistors. The configuration transistors can be programmed to connect the lines at the PIPs or to leave the lines unconnected. Output drivers provide a source of signals from the logic blocks and I/O pads. PIPs connect the output drivers to one or more destinations via one or more PIPs and lines.

The contention eliminating circuit of the present invention holds the signals from the output drivers to a single level until PIP programming has been completed. The circuit of one embodiment comprises a two-input AND gate which combines the incoming data signals with an enabling signal, ENOUT. For each AND gate, one AND gate input terminal receives and propagates the incoming data used for transmission to the interconnect lines and to inputs, while the second input terminal receives an enable signal which prevents the propagation of the input data to the routing matrix until programming of the PIPs is completed.

A different solution is provided for internal tri-statable buffers (TBUFs) used to drive long transmission lines. In some embodiments, long-lines traverse the FPGA, usually both vertically and horizontally, carrying signals relatively long distances across the integrated circuit, and connecting to PIPs at various locations along the FPGA. In order to avoid contention among the various TBUF output signals, a contention circuit is implemented to gate the tri-state control signal on the TBUF driver. In one embodiment, the contention circuit comprises a two-input OR gate in which a set of tri-state enable signals (TS1, TS2 and TS3) are combined with a global long line enabling signal, ENLL.

BRIEF DESCRIPTION OF THE DRAWINGS

FIG. 1A illustrates one circuit for implementing a PIP;

FIG. 4 is a diagram of a circuit that implements the delay shown in the timing diagram of FIG. 3;

FIG. 4A shows a delay element usable in the circuit of FIG. 4;

DETAILED DESCRIPTION OF THE PREFERRED EMBODIMENT

Figure 2:
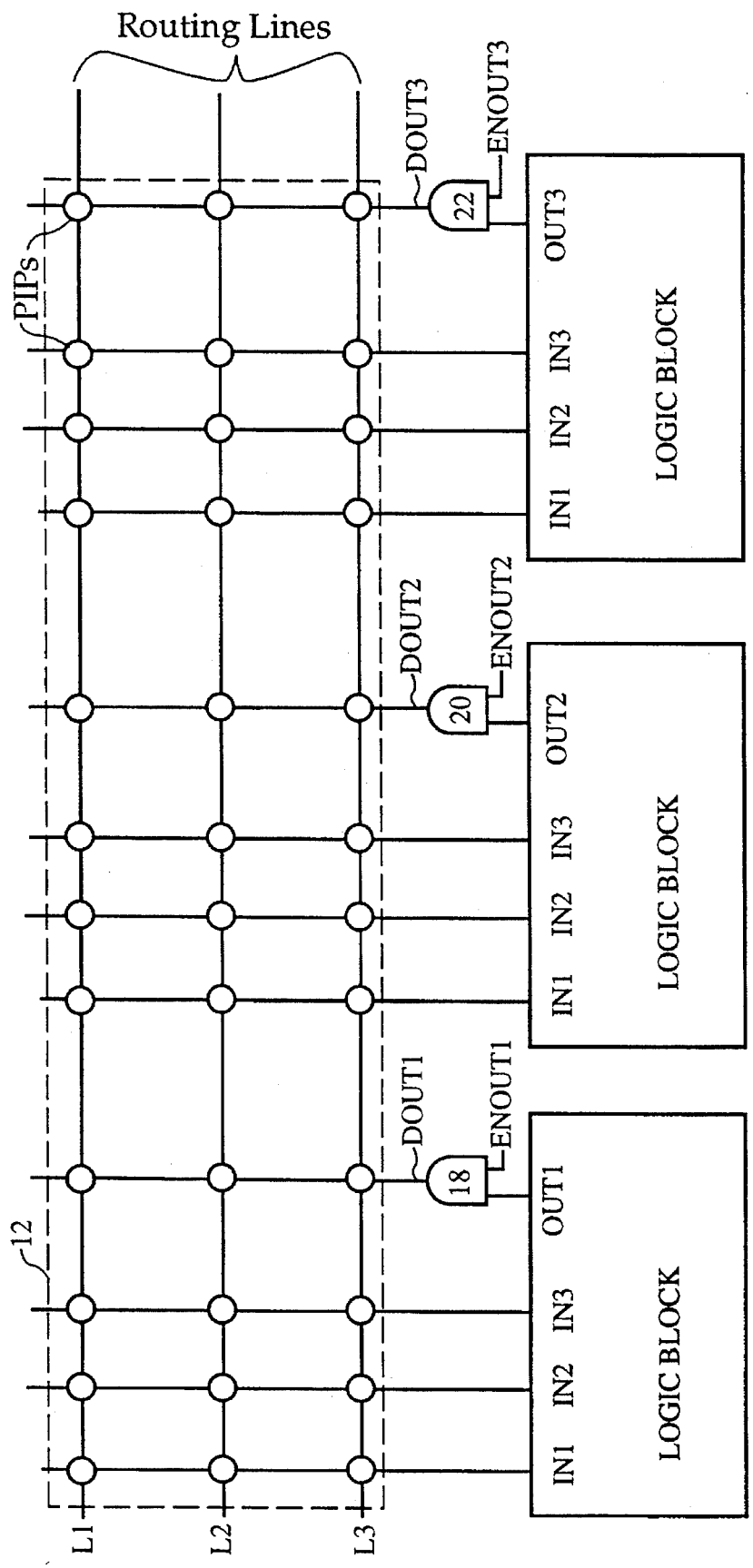
FIG. 2 is a schematic diagram of an FPGA routing matrix of the present invention, including AND gate output drivers in conjunction with the PIPs and input lines.

FIG. 2 shows a schematic diagram of an FPGA routing matrix 10 in accordance with the present invention. In the FPGA, an interconnecting array of lines and switches (PIP array 12) is connectable to output drivers 18, 20, 22 and to input lines IN1, IN2, IN3 of a plurality of logic blocks. The PIP array 12 contains a matrix of programmable interconnect points (PIPs) consisting of configuration transistors which can be programmed to connect or not connect the intersecting lines. The structure of PIP array 12 is explained in detail in co-pending U.S. patent application Ser. No. 08/222,138 filed concurrently by Danesh Tavana and Wilson K. Yee entitled "TILE BASED ARCHITECTURE FOR FPGA", which is incorporated herein by reference.

When power is first applied to the FPGA routing matrix 10, the configuration transistors within the PIPs may fluctuate for a short time between unpredictable states of conductance. Some of the transistors may be in a conduction mode, producing connections at the corresponding PIPs. The problem created by this unintended conducting state is a substantial likelihood that two or more output signals such as DOUT1–DOUT3 of the output drivers 18, 20, 22 may become simultaneously connected to the same routing line and yet carry different logic values and thus different voltages. The shorting together of different output signals DOUT1–DOUT3 may result in permanent damage to the integrated circuit containing the PIP array 12. At best, during a contention condition a substantial amount of current will be drawn by the FPGA. An analogous contention problem exists during reconfiguration, since during the conversion from the first configuration to the second configuration, transitional contention may occur among the output signals DOUT1–DOUT3 as the reconfiguration progresses.

In accordance with the invention, using a circuit such as shown in FIG. 2, upon start-up, prior to, and during configuration or reconfiguration, output signals such as DOUT1–DOUT3 are set to the same state or tri-stated to prevent these random short circuits.

Figure 2A:
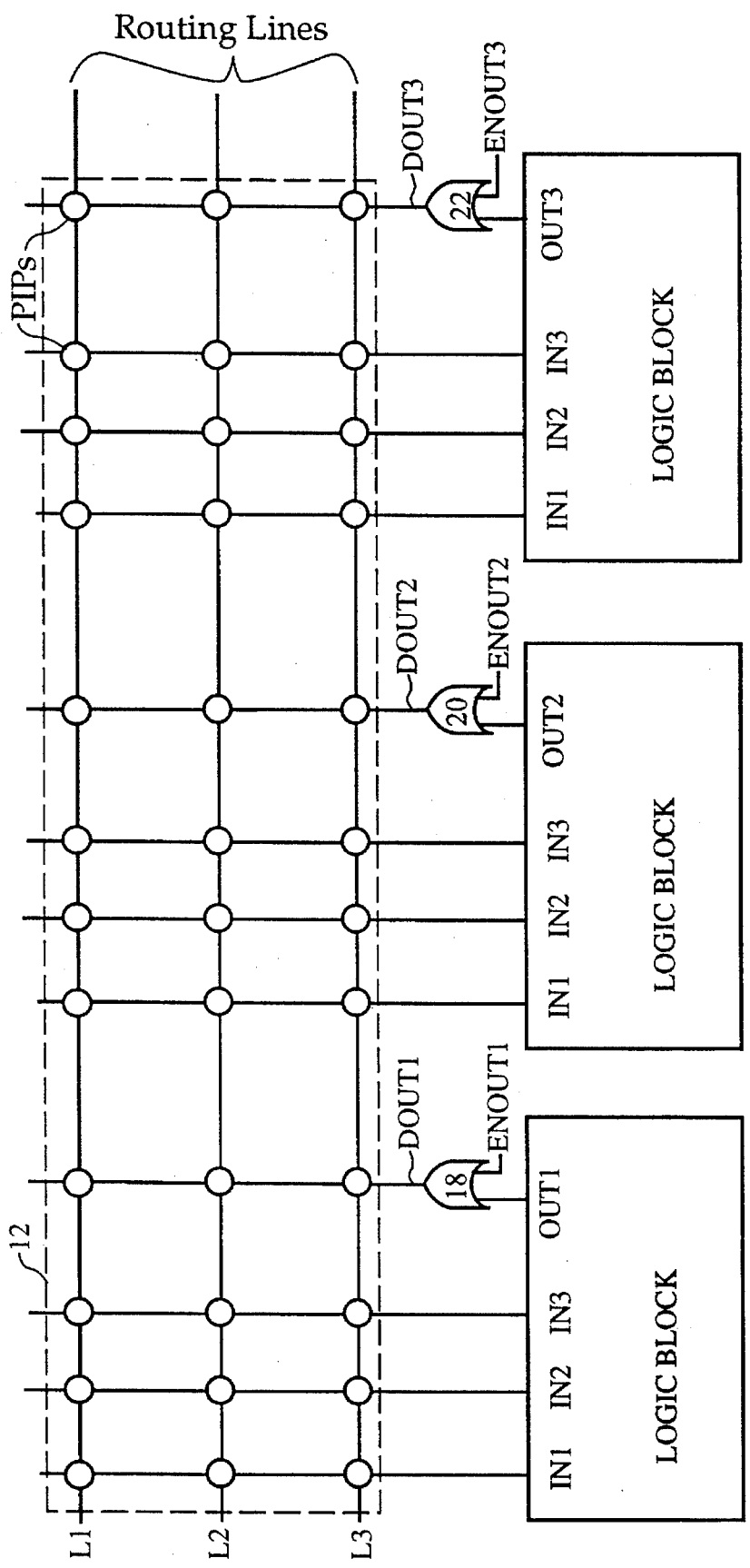
FIG. 2A is a schematic diagram of an FPGA routing matrix of the present invention, including OR gate output drivers in conjunction with the PIPs and input lines.

The circuit of FIG. 2 includes AND gates 18, 20, and 22 for setting the output signals DOUT1–DOUT3 to the same value until settling of the PIP array 12 can be assured. The AND gates 18, 20, and 22, logically combine logic block output signals OUT1 through OUT3 with output enable signals ENOUT1–ENOUT3, to prevent propagation of the logic block output signals OUT1 through OUT3 until the output enable signals ENOUT1–ENOUT3 become active. The illustrated circuit of FIG. 2 uses an AND gate function, although many other combinational equivalents will also work effectively. For instance, an OR gate, as shown in FIG. 2A or a NAND gate combined with an inverter may be equivalently used in place of each of the AND gates 18, 20, and 22.

Figure 1:
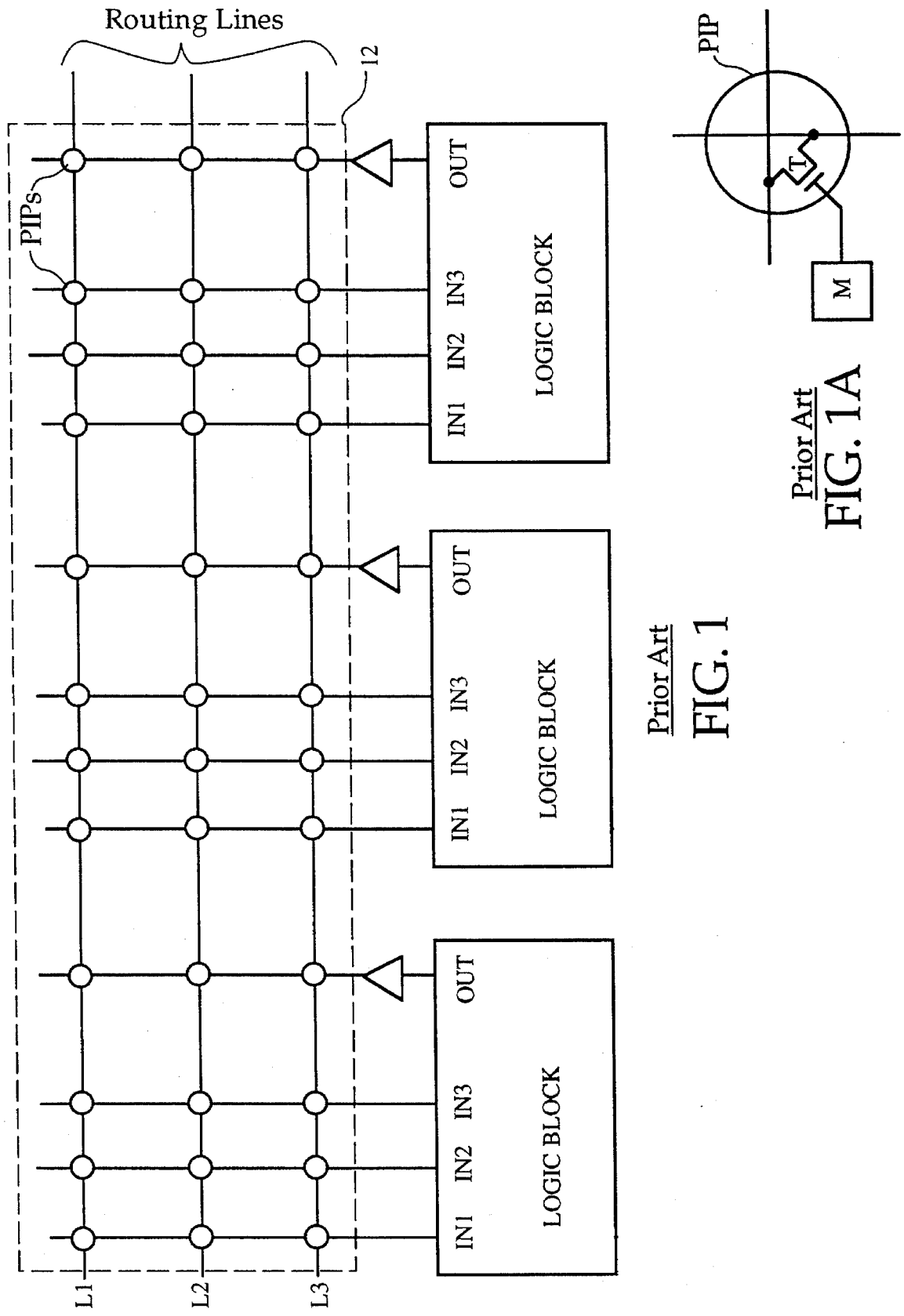
FIG. 1 is a prior art schematic diagram of a conventional FPGA routing matrix illustrating the relationship between the logic block input drivers, output drivers and the PIPs.

To disable propagation of the logic block output signals OUT1 through OUT3 at the AND gates 18, 20, and 22, the output enable signals ENOUT1–ENOUT3 are set low for each of the AND gates 18, 20 and 22, thus forcing AND gates 18, 20, and 22 to output a logic low during power-up, prior to, and during the configuration and reconfiguration of the PIP array 12. The output enable signals ENOUT1–ENOUT3 are generated from a global ENOUT signal, discussed in more detail below with reference to FIG. 4. The configuration data are then sent to the PIP configuration memory cells (see memory cell M in FIG. 1A) using configuration circuitry not part of the present invention. One configuration circuit comprises a shift register connecting the configuration memory cells as discussed by Freeman in U.S. Pat. No. Re. 34,363. Another uses a shift register in combination with a parallel shifter to shift bits into the configuration memory cells. Yet another forms the configuration memory cells as an array in which each memory cell or each word, of memory cells can be randomly addressed as in a conventional memory.

Once the configuration of the PIP array 12 is complete, the output enable signals ENOUT1–ENOUT3 are set high to enable the propagation of the logic block output signals OUT1 through OUT3 to the input lines IN1–IN3 through the PIPs.

Figure 3:
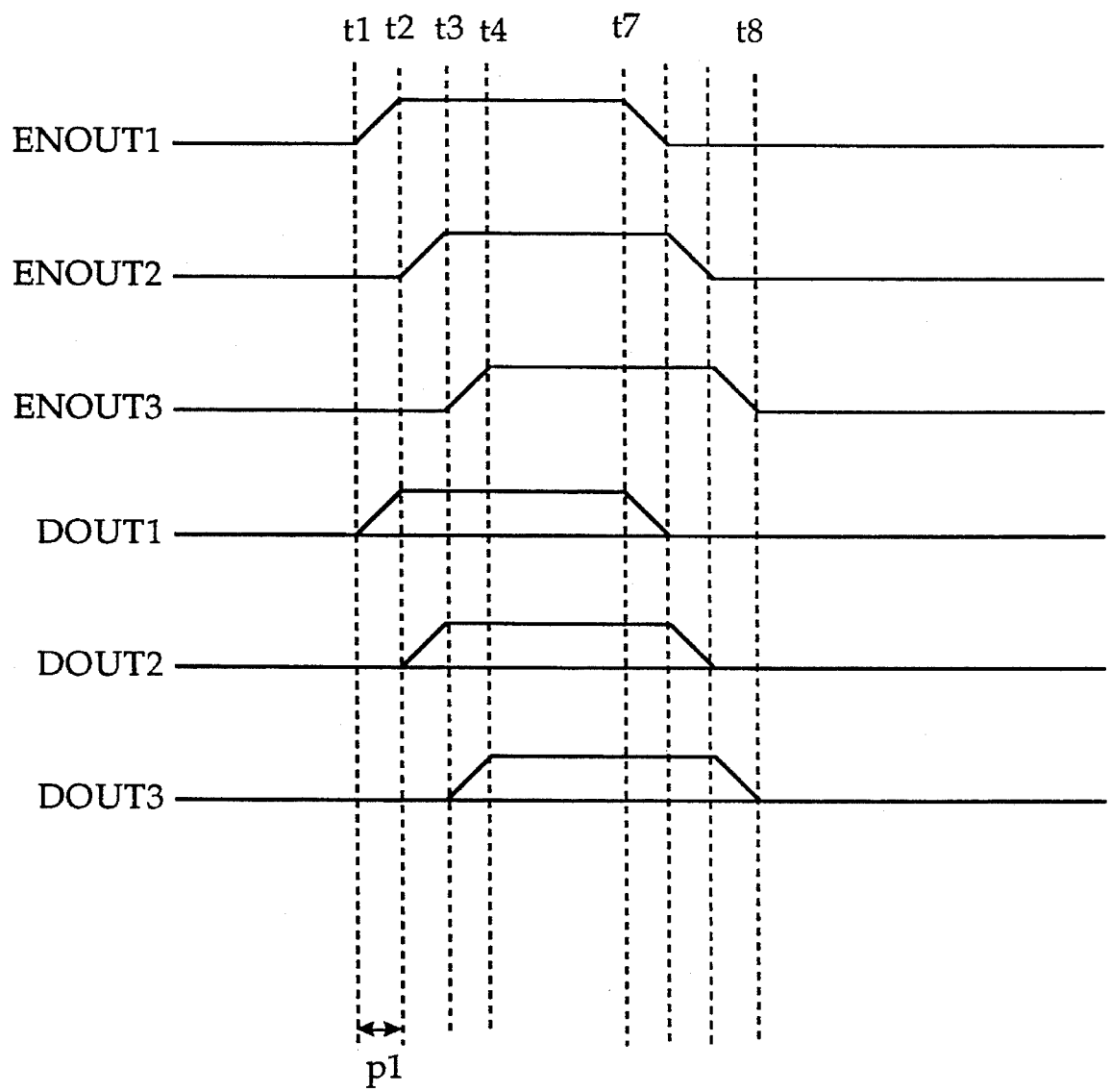
FIG. 3 is a timing diagram of the output driver signals (DOUT1–DOUT3) shown in FIG. 2.

FIG. 3 shows a timing diagram which illustrates the operation and timing of the output enable signals ENOUT1–ENOUT3 of FIG. 2. Time periods p1 are inserted to reduce the number of signals switching simultaneously in order to prevent surges in the supply system. Prior to time t1, the FPGA undergoes power-up and configuration, during which time the global signals ENOUT1–ENOUT3 are set to logic low to disable the AND gates 18, 20, 22. At time t1, the configuration has been completed and the global signals ENOUT1–ENOUT3 start to be sequentially set to logic high, thereby enabling the corresponding AND gates 18, 20, and 22, respectively. Signal ENOUT1 is switched first at time t1, thus allowing AND gate 18 to propagate the incoming data signal OUT1 to DOUT1. A short duration of p1 (several nanoseconds in one embodiment), elapses before signal ENOUT2 switches to logic high, thus allowing DOUT2 to transition in response to the incoming data signal OUT2. Likewise, ENOUT3 is switched at time t3, enabling IN3 to propagate as DOUT3 through AND gate 22. Time t4 represents the point at which all output signals DOUT1–DOUT3 are enabled following the switching of the global signal ENOUT1–ENOUT3. Following time t4, the FPGA is ready for use. Time t7 identifies the beginning of a reconfiguration protocol of the PIP array 12, in which the global signals ENOUT1–ENOUT3 are set to logic low to disable the output driver 14. Again, the signals ENOUT1–ENOUT3 are sequenced to minimize current surges. After the global signals ENOUT1–ENOUT3 have switched to logic low, at time t8, the PIP array 12 is ready for reconfiguration.

FIG. 4 shows a schematic diagram of a circuit for implementing the required delay between ENOUT1 and ENOUT2, and the delay between ENOUT2 and ENOUT3. The global output enable signal ENOUT drives delay element 27a to generate output enable signal ENOUT1. ENOUT1 is connected to AND gate 18 in FIG. 2 and also drives delay element 27b to generate output enable signal ENOUT 2. Output enable signal ENOUT2 is connected to gate 20 in FIG. 2, and also drives delay element 27c to generate output enable signal ENOUT3. Output enable signal ENOUT3 controls gate 22. Delay elements 27a, 27b, and 27c are preferably implemented by sequencing a string of digital logic gates, with each gate having a finite propagation delay. FIG. 4A shows one implementation of delay element 27a comprising a string of four inverters. Other delay means are well known and can alternatively be used.

Figure 5:
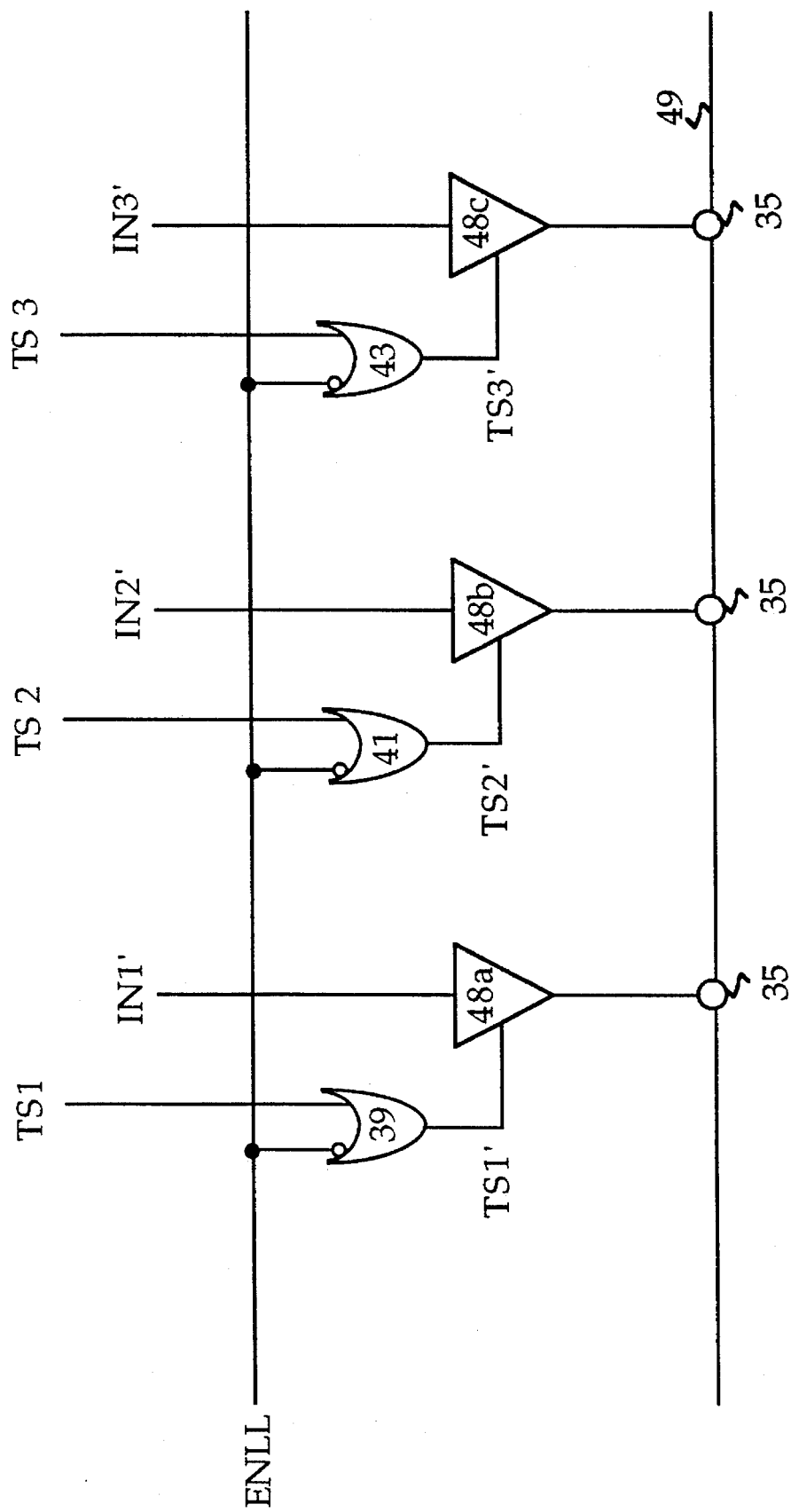
FIG. 5 is a schematic diagram of an alternative FPGA circuit of the present invention which includes an OR gate, tri-statable output buffers in conjunction with PIPs, and input buffers.

FIG. 5 shows a schematic diagram illustrating an alternative embodiment of the present invention, for use with long-lines and tri-state buffers 48a–48c. In some FPGAs, long-lines 49 traverse a major portion of the FPGA, some vertically and some horizontally, in one example half the FPGA, in another example, the full height or width of the FPGA. These long lines are typically used for carrying signals relatively long distances across the integrated circuit or for buses to which a choice of many signals may be connected. These long-lines 49 connect to PIPs (see FIG. 2) at various locations along the FPGA. Transmission onto long-lines 49 is controlled by tri-statable buffers (TBUFs) 48a–48c. Several TBUFs 48a–48c may be connected to a single long line via PIPs 35 to form a bus. Since each TBUF 48a–48c has an independent tri-state control signal TS1–TS3, the user can design circuits that use the same bus but have no contention during normal operation.

However, a problem would occur when the ENOUT signals are switching if tristate control lines TS1–TS3 were to directly control TBUFs 48a–48c. Tri-state control signals TS1–TS3 for the TBUFs 48a–48c come from a logic block in the FPGA routing matrix 10. Since the incoming data signal IN1'– IN3' to the TBUFs 48a–48c also come from the FPGA routing matrix 10, the values of IN1'–IN3' are indeterminate during this period. In one embodiment, the common signal applied during configuration to lines in the routing matrix is logic low and the tristate buffers such as 48a–48c are active low. Consequently, buffers 48a–48c would be on during the period in which ENOUT1–ENOUT3 are switching (during the periods between times t1–t3 and between times t7 and t8 in FIG. 3), resulting in incoming data signal IN1'–IN3' propagation and contention among multiple TBUFs 48a–48c.

To solve this possible contention problem, the tri-state enable signals TS1–TS3 of TBUFs 48a–48c are gated by OR gates 39, 41, and 43, respectively. One input of each OR gate 39, 41, and 43 is connected to a corresponding tri-state enable signal TS1–TS3. The other input (which is inverted) is connected to a global, active high, tri-state enable signal ENLL. The outputs TS1'–TS3' of OR gates 39, 41, and 43, each control a corresponding tri-state enable input to the TBUFs 48a–48c, respectively. During power-on, configuration (reconfiguration), and for a duration after the output enable signals ENOUT1–ENOUT3 have all switched to logic high, ENLL is held at logic low to tri-state the TBUFs 48a–48c. As long as ENLL is held at logic low, the TBUFs 48a–48c will remain tri-stated and there is no possibility of contention between the TBUF 48a–48c outputs. ENLL is preferably held at logic low for a short duration after ENOUT1–ENOUT3 are switched in order to allow the tri-state control signals TS1–TS3, which may be sourced by AND gates 18, 20 and 22 (in FIG. 2), to stabilize. During normal operation, ENLL is set high and the tri-state control signals TS1–TS3 are allowed to propagate to TS1'–TS3', thus allowing the TBUFs 48a–48c to be independently tri-stated.

Figure 6:
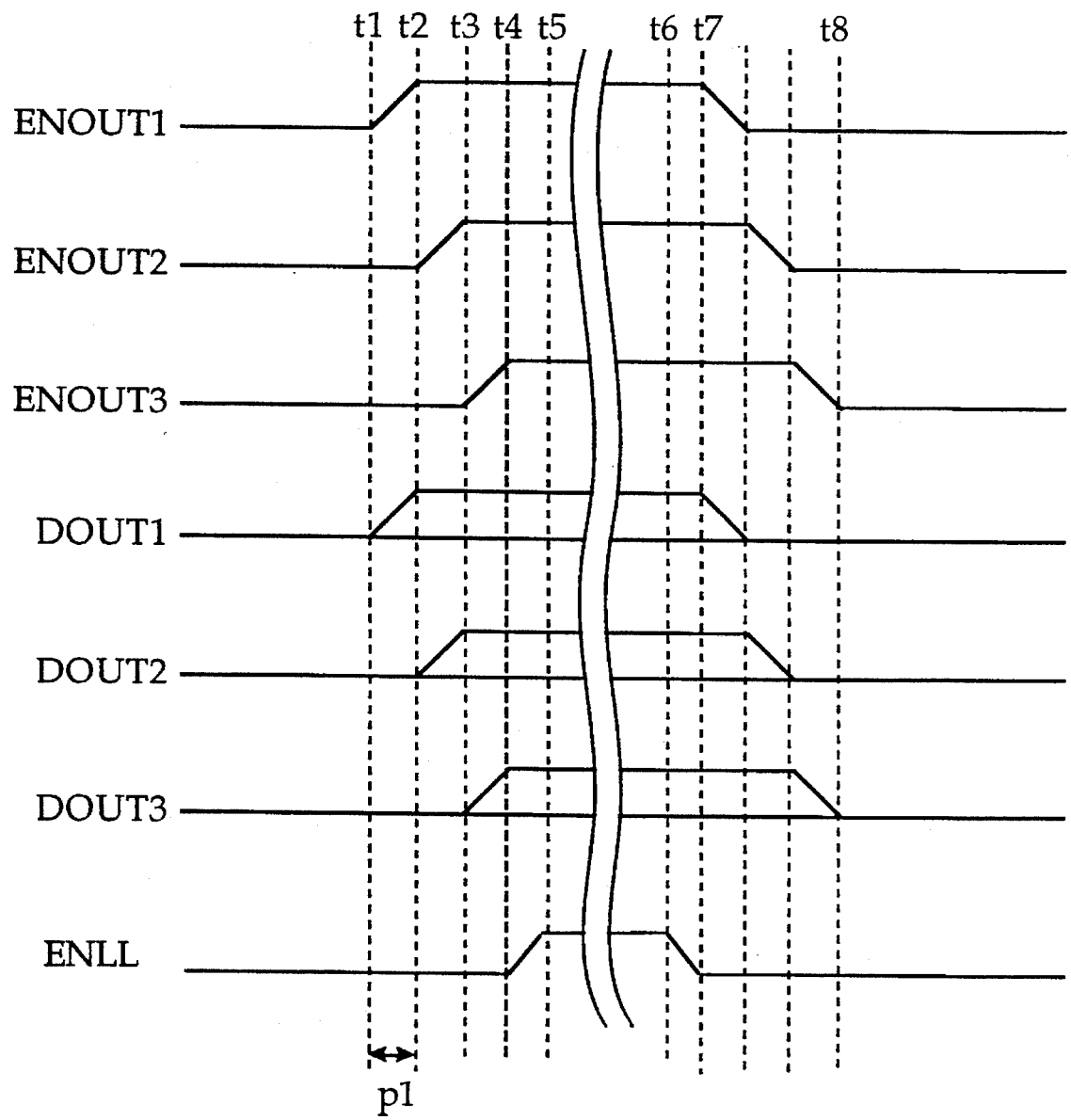
FIG. 6 is a timing diagram of the ENLL signal in the alternative circuit shown in FIG. 5.

FIG. 6 shows a timing diagram which illustrates the operation and timing of the global tri-state signal ENLL of FIG. 5, relative to the timing signals of the FPGA routing matrix 10 illustrated in FIG. 3. The signal ENLL is held low before time t4, resulting in the tri-stating of all TBUFs 48a–48c during this period. After ENOUT3, has switched to high, ENLL is switched to high; thus the tri-state control of each of the TBUFs 48a–48c is then controlled by the individual tri-state enable signals TS1–TS3. Following time t5, and prior to the beginning of the reconfiguration sequence initiated at time t6, the FPGA is available for use. At time t6, ENLL is switched to logic low with or before the switching of the first output enable signal ENOUT1 at time t7.

Figure 7:
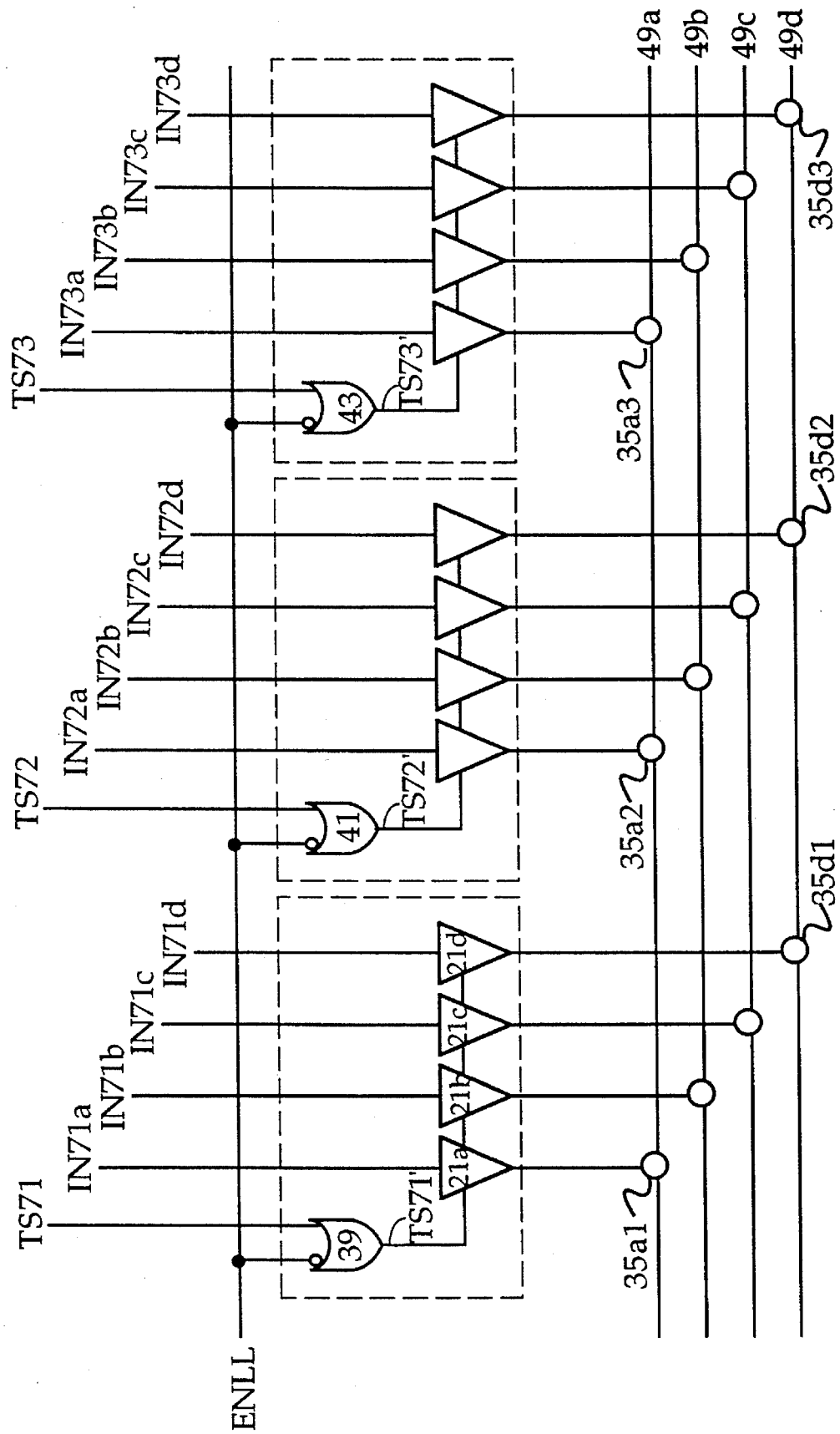
FIG. 7 is a schematic diagram of an FPGA circuit similar to that of FIG. 5, in which four tristate buffers are enabled by a single signal.

FIG. 7 is a schematic diagram of an FPGA circuit similar to that of FIG. 5, in which four tristate buffers are enabled by a single signal and place their output signals onto different long lines. As in FIG. 5, three OR gates 39, 41, 43 are enabled by global signal ENLL. The output signal from each OR gate 39, 41, or 43 enables four tristate buffers. For example, OR gate 39 controls buffers 21a–21d. Output signals from buffers 21a–21d are programmably connected by PIPs 35a1 through 35d1 to long lines 49a through 49d as shown. This arrangement allows a 4-bit value input on lines IN71a through IN71d to be placed onto a 4-line bus comprising lines 49a–49d under control of a single signal on line TS71. Likewise signals on four lines IN72a through IN72d may be placed onto this same bus by a tristate control signal to OR gate 41 on line TS72. Such an embodiment is discussed more thoroughly in copending patent application Ser. No. 08/222,138.

Figure 7A:
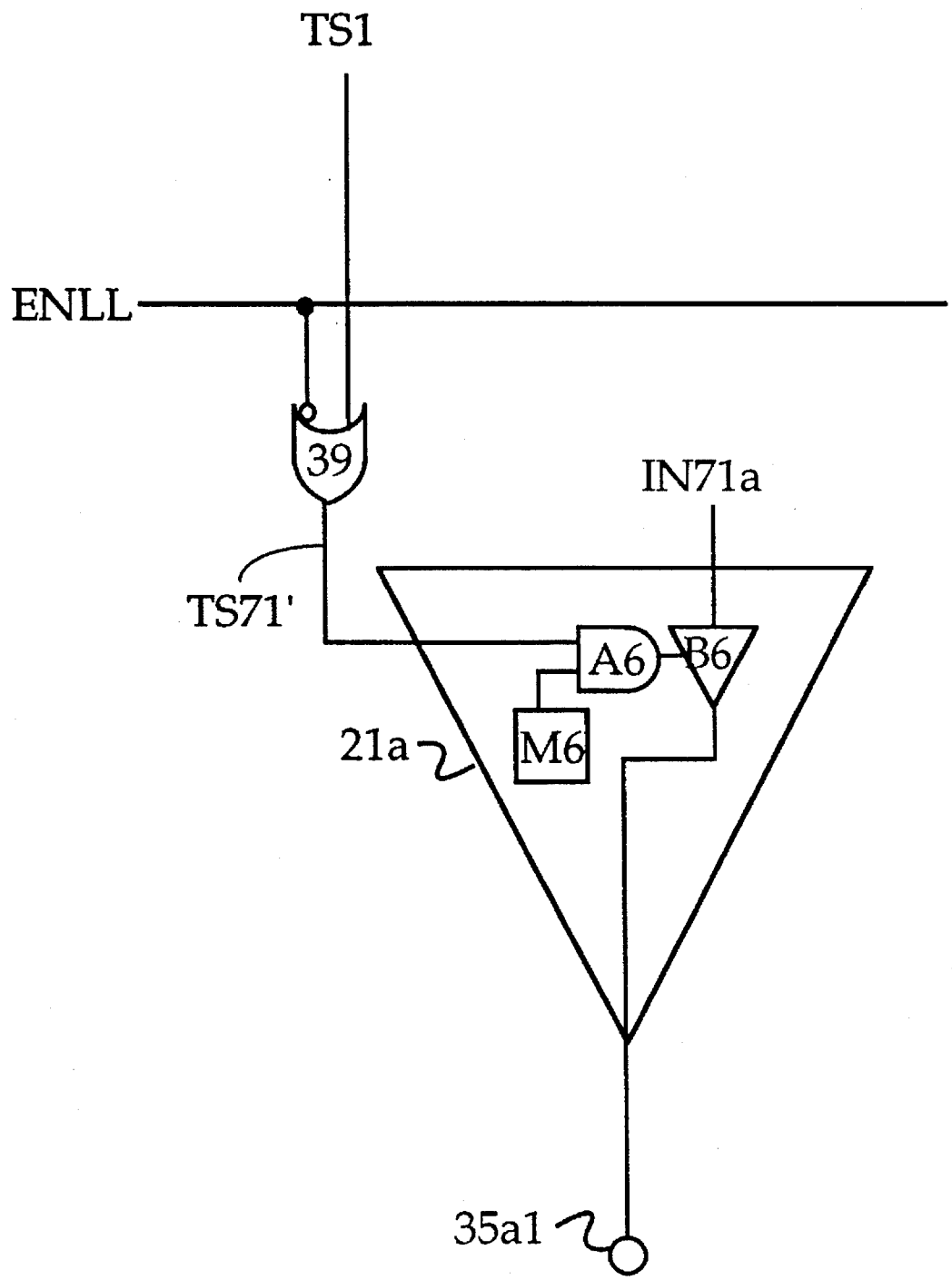
FIG. 7A shows one structure of buffer 21a of FIG. 7.

FIG. 7A shows one structure of buffer 21a of FIG. 7. Each of the buffers such as 21a–21d may comprise a structure such as shown in FIG. 7A. Buffer 21a comprises a conventional tristate buffer B6, which receives input signal IN71a and generates an output signal which is applied to PIP 35a1. Buffer B6 is controlled by AND gate A6. AND gate A6 receives input signals from tristate control line TS71' and from memory cell M6 which is part of the configuration memory.

Memory cell M6 is set to logic low when long routing lines 49a–49d are to be used for carrying signals from lines IN71a–IN71d to other parts of the chip. When memory cell M6 carries logic low, AND gate A6 always outputs logic low, thus putting buffer B6 into a conducting mode and applying a signal to PIP 35a1, regardless of whether ENLL or TS71 carry high or low signals. Thus a low value in memory cell M6 always places the input signal from line IN71a onto PIP 35a1. The low value in memory cell M6 causes buffer 21a to be conductive even during configuration. However, this does not cause contention during configuration because the ENOUT signals discussed above bring input line IN71a to a common signal (logic low in the embodiment discussed above) so that the long lines driven by the output of buffer 21a are not left floating and also are not in contention during configuration.

Memory cell M6 is set to logic high when routing lines 49a–49d are to be used as a bus. When memory cell M6 carries a logic high signal, the value on tristate control line TS71' controls buffer B6. In the bus mode, a logic high signal on tristate control line TS71' causes AND gate A6 to disable buffer B6. A logic high on tristate control line TS71' can be produced either by a low global ENLL signal (during configuration) or by a high individual tristate control signal TS71 (during operation). The ENLL global signal prevents the input signal on line IN71a from being placed onto the interconnect structure while the device is being configured. Global signal ENLL thus prevents contention with other signals such as that on line IN72a which may have a different value and which without the invention might be inadvertently connected to the same long line.

The invention has now been explained with reference to specific embodiments. Other embodiments will be apparent to those of ordinary skill in the art in light of this disclosure. Therefore, it is not intended that this invention be limited except as indicated by the appended claims.

What is claimed is:

1. A circuit for contention free configuration in a field programmable gate array, the circuit comprising:
    an array of programmable interconnect points, the array having a plurality of input terminals including a first array input terminal;
    a first selector comprising:
        an output terminal coupled to the first array input terminal,
        a first data input terminal for receiving a first data signal to be transmitted to the first array input terminal,
        an enable input terminal for receiving an enable signal, and
        means for alternatively causing the first selector to provide one of a common signal and the first incoming data signal to the output terminal; and
    a logic block for providing the first incoming data signal to the first data input terminal; and
    a second selector coupled to a second array input terminal, the second selector having a second data input terminal for receiving incoming data and an enable input terminal for receiving an enable signal, the second selector having means to enable the second selector to transmit the incoming data to the second array input terminal;
    wherein the receipt of the enable signal by the second selector occurs after the receipt of the enable signal by the first selector.

2. The circuit according to claim 1, wherein the first selector implements a logical AND function of the enable signal and the first incoming data signal.

3. The circuit according to claim 1, wherein the enable signal to the first selector occurs over at least the time span of the enable signal to the second selector, whereby the second selector is disabled for at least the time the first selector is disabled.

4. The circuit according to claim 3, wherein unless one of the first or second selectors are enabled to transmit incoming data, the output signals of the first and second selectors are set at the same value.

5. The circuit according to claim 1, wherein the first selector implements a logical OR function of the incoming data signal and the enable signal.

6. A circuit for contention free configuration in a field programmable gate array, the circuit comprising:
    an array of programmable interconnect points, the array having a plurality of input terminals including a first array input terminal;
    a tri-stable driver comprising:
        an output terminal coupled to the first array input terminal,
        a first data input terminal for receiving a first data signal to be transmitted to the first array input terminal,
        an enable input terminal for receiving an enable signal, and
        means for alternatively causing the tri-statable driver to provide one of the enable signal and the first incoming data signal to the output terminal;
    wherein the enable signal is generated by a logic gate having a first input terminal connected to receive a global tri-state enable signal and a second input terminal connected to receive a local tri-state enable signal.

7. The circuit according to claim 1, wherein the first selector is coupled to the array of programmable interconnect points through a long line.

8. A method for contention free operation of a routing matrix in an FPGA, wherein a plurality of interconnect lines are each coupled to a corresponding signal driver, the method comprising the steps of:
    (i) disabling each of the signal drivers during power-up and initialization of the FPGA;
    (ii) sequentially enabling the signal drives to permit data transmission to the interconnect lines once configuration is complete, such that a sufficient time period elapses between enabling of one signal driver and enabling of the next signal driver to prevent a surge in power supply voltages.

9. The method of operation according to claim 8, wherein during the step of disabling of each of the signal drivers, the plurality of interconnect lines are all driven to a common value.

10. A method for contention free operation of a routing matrix in an FPGA, wherein a plurality of interconnect lines are each coupled to a corresponding signal driver, the method comprising the steps of:
    (i) disabling each of the signal drivers during power-up and initialization of the FPGA;
    (ii) enabling the signal drivers to permit data transmission to the interconnect lines once configuration is complete;
    (iii) disabling the signal drivers to permit reconfiguration of the FPGA; and
    (iiii) enabling the signal drivers to permit data transmission to the interconnect lines once reconfiguration is complete;
    wherein the signal drivers are disabled sequentially during reconfiguration such that a sufficient time period elapses between disabling of one signal driver and disabling of the next signal driver to prevent a surge in power supply voltages.

* * * * *